(12) United States Patent
Sekiya (10) Patent No.: US 11,018,059 B2
(45) Date of Patent: May 25, 2021

(54) SIC SUBSTRATE PROCESSING METHOD

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/545,677

(22) Filed: Aug. 20, 2019

(65) Prior Publication Data

US 2020/0075414 A1 Mar. 5, 2020

(30) Foreign Application Priority Data

Aug. 28, 2018 (JP) .............................. JP2018-159320

(51) Int. Cl.

| | |
|---|---|
| *H01L 21/78* | (2006.01) |
| *B23K 26/00* | (2014.01) |
| *B23K 26/082* | (2014.01) |
| *H01L 21/268* | (2006.01) |
| *H01L 33/34* | (2010.01) |
| *H01L 33/00* | (2010.01) |
| *H01L 21/304* | (2006.01) |
| *B23K 101/40* | (2006.01) |

(52) U.S. Cl.
CPC ...... *H01L 21/7813* (2013.01); *B23K 26/0006* (2013.01); *B23K 26/082* (2015.10); *H01L 21/268* (2013.01); *H01L 21/304* (2013.01); *H01L 33/0054* (2013.01); *H01L 33/34* (2013.01); *B23K 2101/40* (2018.08)

(58) Field of Classification Search
CPC .. B23K 26/0006; B23K 26/53; B23K 26/048; B23K 26/0622; B23K 26/0876; B23K 26/032; B23K 26/0823; B23K 26/082; B23K 2101/40; B23K 2103/56; H01L 21/02013; H01L 21/02008; H01L 21/0201; H01L 21/304
See application file for complete search history.

(56) References Cited

U.S. PATENT DOCUMENTS

| | | | |
|---|---|---|---|
| 7,811,900 B2* | 10/2010 | Henley | H01L 21/76254 438/458 |
| 2016/0336233 A1* | 11/2016 | Yonehara | B23K 26/082 |
| 2017/0025276 A1* | 1/2017 | Hirata | B28D 5/0011 |
| 2017/0136572 A1* | 5/2017 | Hirata | B23K 26/0876 |
| 2018/0085851 A1* | 3/2018 | Hirata | B23K 26/40 |
| 2018/0218896 A1* | 8/2018 | Hirata | H01L 21/02013 |

FOREIGN PATENT DOCUMENTS

| | | |
|---|---|---|
| JP | 2000094221 A | 4/2000 |
| JP | 2016111143 A | 6/2016 |

* cited by examiner

*Primary Examiner* — Michael M Trinh
(74) *Attorney, Agent, or Firm* — Greer, Burns & Crain, Ltd.

(57) ABSTRACT

An SiC substrate processing method for producing an SiC substrate from an SiC ingot. The SiC substrate processing method includes a separation layer forming step of setting a focal point of a laser beam having a transmission wavelength to SiC inside the SiC ingot at a predetermined depth from the upper surface of the SiC ingot and next applying the laser beam LB to the SiC ingot to thereby form a separation layer for separating the SiC substrate from the SiC ingot, a substrate attaching step of attaching a substrate to the upper surface of the SiC ingot, and a separating step of applying an external force to the separation layer to thereby separate the SiC substrate with the substrate from the SiC ingot along the separation layer.

3 Claims, 7 Drawing Sheets

SIC SUBSTRATE PROCESSING METHOD

BACKGROUND OF THE INVENTION

Field of the Invention

The present invention relates to an SiC substrate processing method for producing an SiC substrate from an SiC ingot.

Description of the Related Art

Various devices such as power devices and light emitting diodes (LEDs) are formed by forming a functional layer on the upper surface of an SiC substrate and partitioning this functional layer into a plurality of separate regions along a plurality of crossing division lines. Thus, the plural devices are separately formed on the upper surface of the SiC substrate to obtain a wafer having the plural devices. The division lines of the wafer having these plural devices are processed by a processing apparatus such as a laser processing apparatus to thereby divide the wafer into a plurality of individual device chips respectively corresponding to the plural devices. The device chips thus obtained are used in control units and automobile parts, for example.

In general, the SiC substrate is produced by slicing a cylindrical SiC ingot with a wire saw. Both sides of the SiC substrate sliced from the SiC ingot are polished to a mirror finish (see JP 2000-94221A, for example). However, when the SiC ingot is cut by the wire saw and both sides of each SiC substrate are polished to obtain the product, a large proportion (70% to 80%) of the SiC ingot is discarded. Since the SiC ingot is expensive, each SiC substrate becomes considerably expensive. As a result, each device chip using the SiC substrate also becomes expensive.

To cope with this problem, the present applicant has developed a technique (see JP 2016-111143A, for example). This technique includes the steps of setting the focal point of a laser beam having a transmission wavelength to SiC inside an SiC ingot at a predetermined depth corresponding to the thickness of an SiC substrate to be produced, next applying the laser beam to the SiC ingot as scanning the laser beam on the SiC ingot to thereby form a separation layer inside the SiC ingot at the predetermined depth, the separation layer being composed of modified portions in which SiC is decomposed into Si and C in a c-plane and cracks extending from each modified portion along the c-plane, and finally applying an external force to the separation layer to thereby separate the SiC substrate from the SiC ingot along the separation layer.

SUMMARY OF THE INVENTION

However, in processing the SiC substrate in many steps of forming a plurality of devices on the upper surface of the SiC substrate, there is a possibility that the SiC substrate may be damaged. To prevent such possible damage to the SiC substrate, the thickness of the SiC substrate is set to a relatively large value, e.g., approximately 500 to 700 µm. Accordingly, the price of each SiC substrate to be produced from the SiC ingot cannot be sufficiently reduced.

It is therefore an object of the present invention to provide an SiC substrate processing method which can produce an SiC substrate from an SiC ingot efficiently and economically.

In accordance with an aspect of the present invention, there is provided an SiC substrate processing method for producing an SiC substrate from an SiC ingot, including a separation layer forming step of setting a focal point of a laser beam having a transmission wavelength to SiC inside the SiC ingot at a predetermined depth from an upper surface of the SiC ingot, and next applying the laser beam to the SiC ingot to thereby form a separation layer for separating the SiC substrate from the SiC ingot; a substrate attaching step of attaching a substrate to the upper surface of the SiC ingot after performing the separation layer forming step; and a separating step of applying an external force to the separation layer after performing the substrate attaching step, thereby separating the SiC substrate with the substrate from the SiC ingot along the separation layer.

Preferably, the SiC substrate processing method further includes an upper surface flattening step of flattening the upper surface of the SiC ingot before performing the separation layer forming step. Preferably, the SiC substrate processing method further includes a separation surface flattening step of flattening a rough separation surface of the SiC substrate attached to the substrate after performing the separating step, thereby removing the roughness of the rough separation surface to obtain a flat surface of the SiC substrate. More preferably, the SiC substrate processing method further includes a device forming step of forming devices on the flat surface of the SiC substrate after performing the separation surface flattening step. More preferably, the SiC substrate processing method further includes a substrate removing step of removing the substrate from the SiC substrate having the devices on the flat surface after performing the device forming step. Preferably, the predetermined depth where the focal point is set inside the SiC ingot from the upper surface thereof in the separation layer forming step corresponds to the minimum thickness of the SiC substrate to be produced from the SiC ingot so that devices can be formed later on the upper surface of the SiC substrate. More preferably, the predetermined depth from the upper surface of the SiC ingot is set to 30 to 100 µm.

As described above, the separation layer is formed at a shallow position from the upper surface of the SiC ingot in the separation layer forming step. Accordingly, the relatively thin SiC substrate is produced by separating the SiC ingot along the separation layer in the separating step. However, since the substrate is attached to the SiC substrate after performing the separation layer forming step, possible damage to the SiC substrate can be suppressed in the device forming step including many substeps for forming the plural devices on the upper surface (flat surface) of the SiC substrate. Thus, the SiC substrate having a thickness smaller than that of the conventional SiC substrate can be produced from the SiC ingot according to the present invention. Accordingly, a greater number of SiC substrates can be produced efficiently from the SiC ingot as compared with the prior art.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
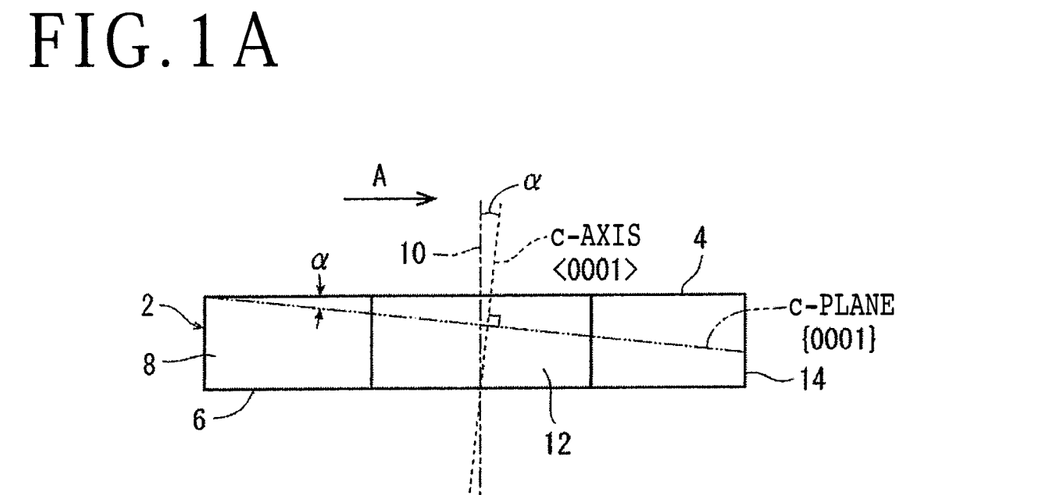
FIG. 1A is an elevational view of an SiC ingot.
Figure 1B:
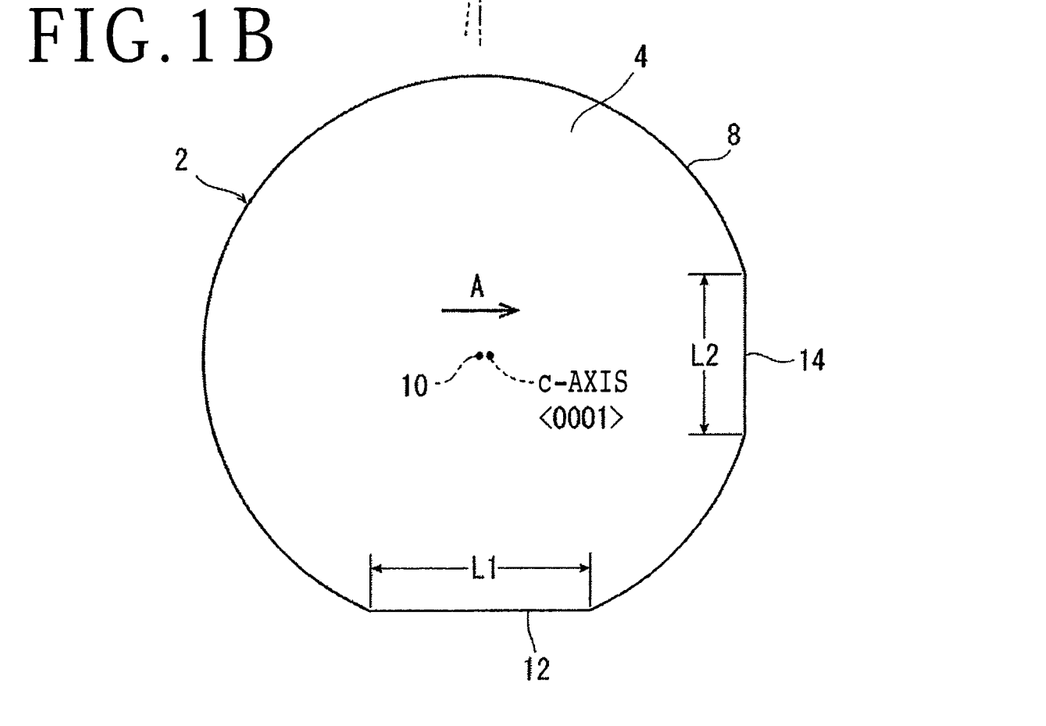
FIG. 1B is a plan view of the SiC ingot depicted in FIG. 1A.

A preferred embodiment of the SiC substrate processing method according to the present invention will now be described with reference to the drawings. FIGS. 1A and 1B depict a hexagonal single-crystal SiC ingot 2 usable in performing the SiC substrate processing method according to the present invention. The SiC ingot 2 has a substantially cylindrical shape. That is, the SiC ingot 2 has a substantially circular first end surface 4, a substantially circular second end surface 6 opposite to the first end surface 4, a substantially cylindrical surface 8 formed so as to connect the first end surface 4 and the second end surface 6, a c-axis (<0001> direction) extending from the first end surface 4 to the second end surface 6, and a c-plane ({0001} plane) perpendicular to the c-axis.

In the SiC ingot 2, the c-axis is inclined by an off angle α (e.g., α=1, 3, or 6 degrees) with respect to a normal 10 to the first end surface 4. The off angle α is formed between the c-plane and the first end surface 4. The direction of formation of the off angle α (i.e., the direction of inclination of the c-axis) is depicted by an arrow A in FIGS. 1A and 1B. Further, the cylindrical surface 8 of the SiC ingot 2 is formed with a first orientation flat 12 and a second orientation flat 14, which are rectangular as viewed in side elevation and function to indicate crystal orientation. The first orientation flat 12 is parallel to the direction A of formation of the off angle α, and the second orientation flat 14 is perpendicular to the direction A of formation of the off angle α. As depicted in FIG. 1B, which is a plan view taken in the direction of extension of the normal 10, the length L2 of the second orientation flat 14 is set shorter than the length L1 of the first orientation flat 12 (L2<L1).

Figure 2:
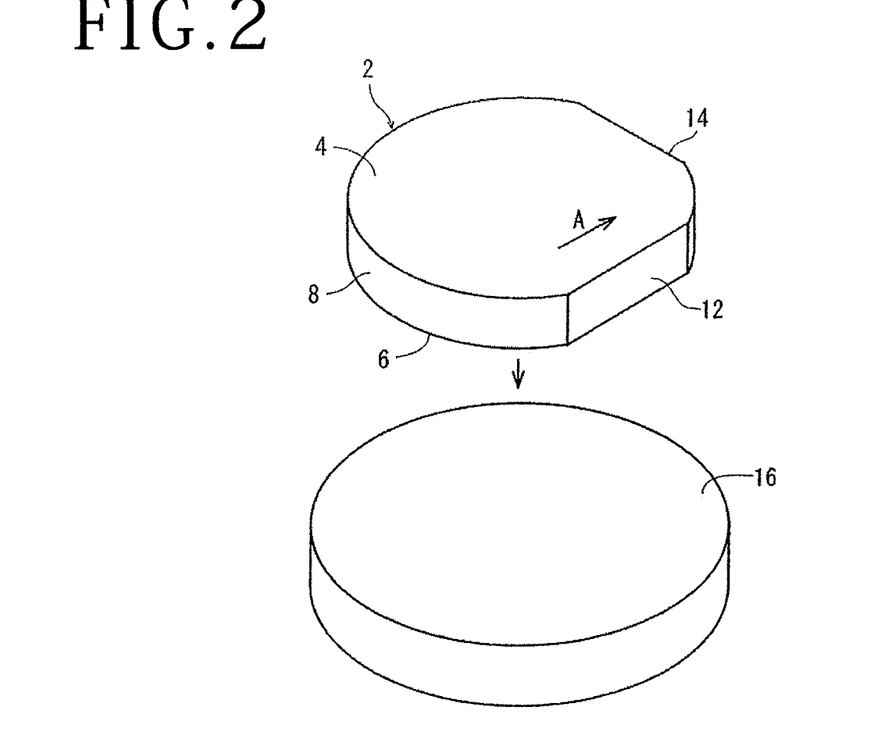
FIG. 2 is a perspective view depicting a manner of placing the SiC ingot on a holding table.

As depicted in FIG. 2, the SiC ingot 2 is fixed to the upper surface of a holding table 16 by using a suitable adhesive (e.g., epoxy resin adhesive) in the condition where the first end surface 4 of the SiC ingot 2 is oriented upward. The holding table 16 has a rotation axis extending in a vertical direction. That is, the holding table 16 is rotatable about its vertical axis. Further, the holding table 16 is movable to a grinding apparatus 18 and to a laser processing apparatus 30, which will be hereinafter described.

Figure 3:
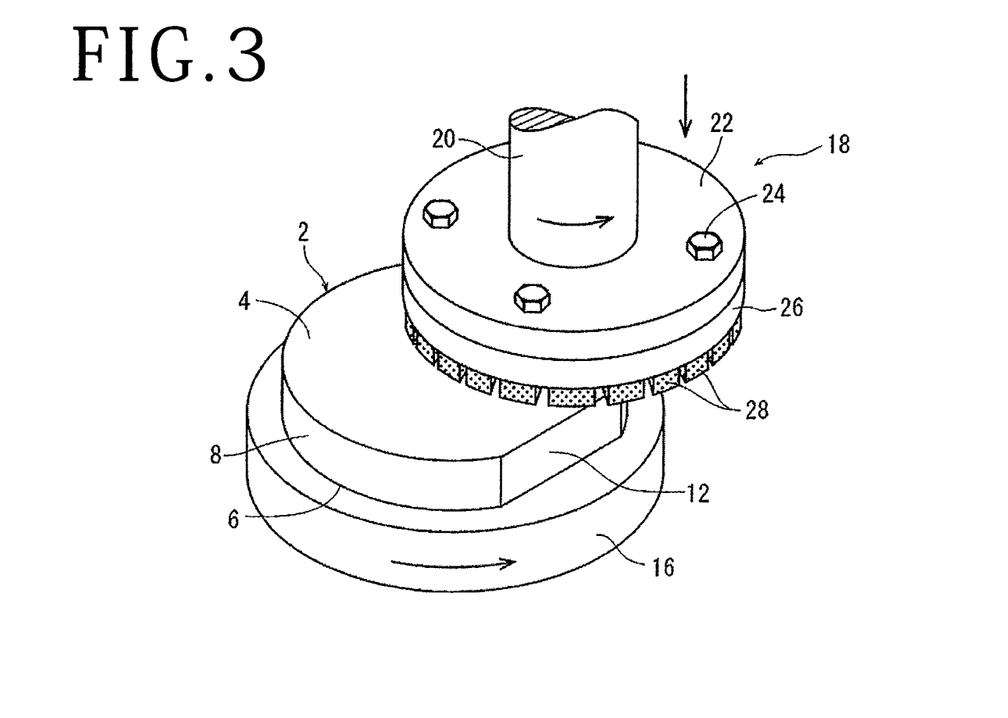
FIG. 3 is a perspective view depicting an upper surface flattening step of flattening the upper surface of the SiC ingot.

After fixing the SiC ingot 2 to the holding table 16, an upper surface flattening step is performed to flatten the upper surface of the SiC ingot 2 (i.e., the first end surface 4 in this preferred embodiment) except the case that the upper surface of the SiC ingot 2 has already been flattened. That is, in the case that the upper surface of the SiC ingot 2 is not flat, the upper surface flattening step is performed. The upper surface flattening step may be performed by using a grinding apparatus 18, a part of which is depicted in FIG. 3. The grinding apparatus 18 includes a spindle 20 having a rotation axis extending in a vertical direction, the spindle 20 being connected to a motor (not depicted), and also includes a disk-shaped wheel mount 22 fixed to the lower end of the spindle 20. An annular grinding wheel 26 is fixed to the lower surface of the wheel mount 22 by bolts 24. A plurality of abrasive members 28 are fixed to the lower surface of the grinding wheel 26 so as to be arranged annularly at given intervals along the outer circumference of the grinding wheel 26.

In performing the upper surface flattening step by using the grinding apparatus 18, the holding table 16 holding the SiC ingot 2 is first moved to a position below the grinding apparatus 18 as depicted in FIG. 3. Thereafter, the holding table 16 is rotated at a predetermined speed (e.g., 300 rpm) in a counterclockwise direction as viewed in plan. Further, the spindle 20 is rotated at a predetermined speed (e.g., 6000 rpm) in a counterclockwise direction as viewed in plan. Thereafter, the spindle 20 is lowered by elevating means (not depicted) included in the grinding apparatus 18 until the abrasive members 28 fixed to the grinding wheel 26 come into contact with the upper surface of the SiC ingot 2 (i.e., the first end surface 4 in this preferred embodiment). Thereafter, the spindle 20 is further lowered at a predetermined feed speed (e.g., 0.1 μm/s) to thereby grind the first end surface 4 of the SiC ingot 2 as the upper surface thereof. Thus, the upper surface of the SiC ingot 2 can be flattened by grinding to such a degree that the entrance of a laser beam to the upper surface of the SiC ingot 2 is not hindered in a separation layer forming step to be hereinafter described.

Figure 4A:
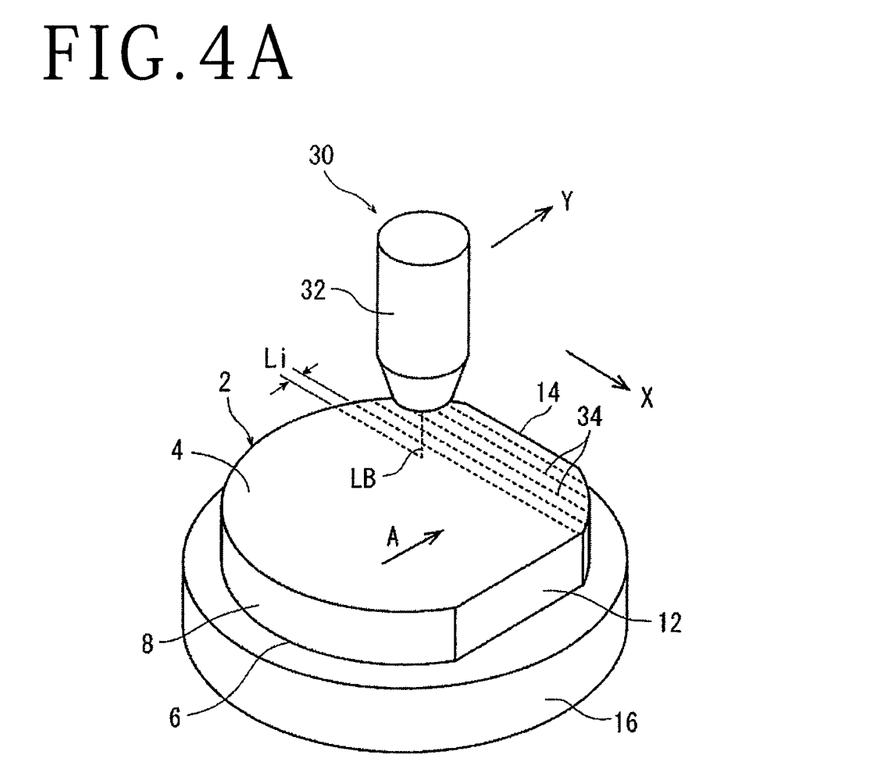
FIG. 4A is a perspective view depicting a separation layer forming step of forming a separation layer inside the SiC ingot.

After performing the upper surface flattening step, a separation layer forming step is performed to form a separation layer for separating an SiC substrate from the SiC ingot 2, by applying a laser beam to the SiC ingot 2 in the condition where the focal point of the laser beam is set inside the SiC ingot 2 at a predetermined depth from the upper surface of the SiC ingot 2, the laser beam having a transmission wavelength to SiC. The separation layer forming step may be performed by using a laser processing apparatus 30, a part of which is depicted in FIG. 4A. The laser processing apparatus 30 includes a pulsed laser oscillator (not depicted) for generating a pulsed laser beam LB and focusing means 32 having a focusing lens (not depicted) for focusing the pulsed laser beam LB generated from the pulsed laser oscillator and applying this pulsed laser beam LB to the SiC ingot 2. The focusing means 32 is movable back and forth both in the X direction depicted by an arrow X in FIG. 4A and in the Y direction depicted by an arrow Y in FIG. 4A, in which the Y direction is perpendicular to the X direction. The X direction and the Y direction define an XY plane, which is a substantially horizontal plane.

In performing the separation layer forming step by using the laser processing apparatus 30, the holding table 16 holding the SiC ingot 2 is first moved to a position below the laser processing apparatus 30 as depicted in FIG. 4A. Thereafter, imaging means (not depicted) included in the laser processing apparatus 30 is operated to image the upper surface of the SiC ingot 2. Thereafter, according to an image obtained by the imaging means, the holding table 16 is rotated and the focusing means 32 is moved to thereby adjust the orientation of the SiC ingot 2 to a predetermined orientation and also adjust the position of the SiC ingot 2 in the XY plane relative to the focusing means 32. In adjusting the orientation of the SiC ingot 2 to a predetermined orientation, the second orientation flat 14 is made parallel to the X direction as depicted in FIG. 4A, so that the direction perpendicular to the direction A of formation of the off angle α is made parallel to the X direction, and the direction A of formation of the off angle α is made parallel to the Y direction as depicted in FIG. 4A.

Thereafter, focal position adjusting means (not depicted) included in the laser processing apparatus 30 is operated to vertically move the focusing means 32, thereby setting the focal point of the pulsed laser beam LB at a predetermined depth from the upper surface (the first end surface 4) of the SiC ingot 2. Preferably, this predetermined depth corresponds to the minimum thickness of an SiC substrate to be produced from the SiC ingot 2, in which devices can be formed later on the upper surface of the SiC substrate. For example, this predetermined depth may be set to approximately 30 to 100 μm.

Figure 4B:
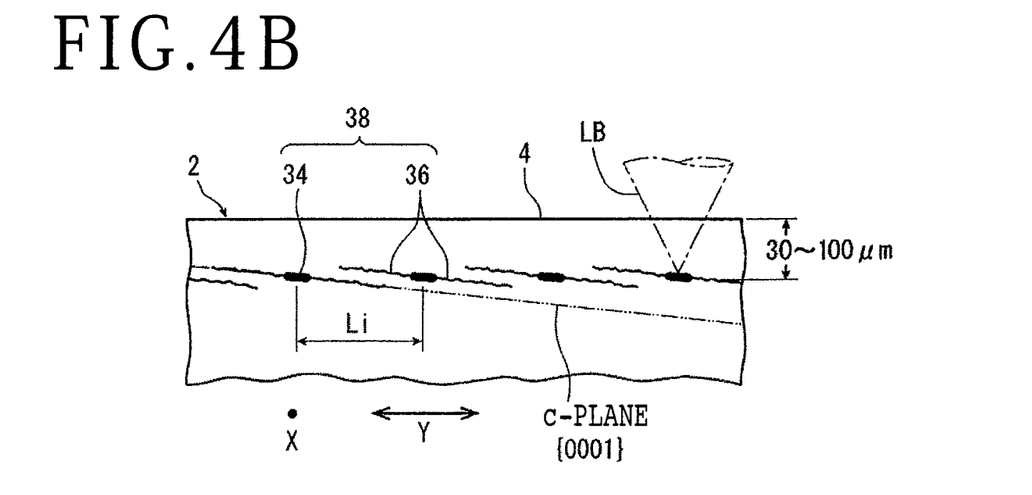
FIG. 4B is a sectional view of the SiC ingot in the condition where the separation layer has been formed inside the SiC ingot in the separation layer forming step.

Thereafter, the pulsed laser beam LB having a transmission wavelength to the SiC ingot 2 is applied from the focusing means 32 to the SiC ingot 2 as moving the focusing means 32 at a predetermined feed speed in the X direction, i.e., in the direction perpendicular to the direction A of formation of the off angle α. More specifically, the pulsed laser beam LB is initially applied to the SiC ingot 2 to thereby decompose SiC into silicon (Si) and carbon (C). Thereafter, the pulsed laser beam LB is next applied to the SiC ingot 2 and absorbed by C previously produced. Thus, SiC is decomposed into Si and C in a chain reaction manner with the movement of the focusing means 32 in the X direction to thereby form a plurality of modified portions 34 linearly arranged in the X direction as depicted in FIGS. 4A and 4B. At the same time, a plurality of cracks 36 are formed isotropically from each modified portion 34 so as to extend along the c-plane as depicted in FIG. 4B. In applying the pulsed laser beam LB to the SiC ingot 2, the holding table 16 may be moved in the X direction with the focusing means 32 fixed in position.

Thereafter, the focusing means 32 is moved relative to the SiC ingot 2 in the Y direction parallel to the direction A of formation of the off angle α by a predetermined index amount Li, which is set to a value less than the value twice the length of each crack 36. Thereafter, the pulsed laser beam LB is similarly applied as moving the focusing means 32 in the X direction. In this manner, the laser applying operation of applying the pulsed laser beam LB as moving the focusing means 32 in the X direction and the indexing operation of indexing the focusing means 32 in the Y direction are repeated to thereby form a separation layer 38 inside the SiC ingot 2 at the predetermined depth from the upper surface of the SiC ingot 2 as depicted in FIG. 4B, in which the separation layer 38 is composed of the plural modified portions 34 arranged both in the X direction and in the Y direction and the plural cracks 36 extending from the modified portions 34. Accordingly, the separation layer 38 has a reduced strength by the formation of the modified portions 34 and the cracks 36. In the above indexing operation, the holding table 16 may be moved in the Y direction with the focusing means 32 fixed in position. For example, the separation layer forming step may be performed under the following laser processing conditions.

Figure 5:
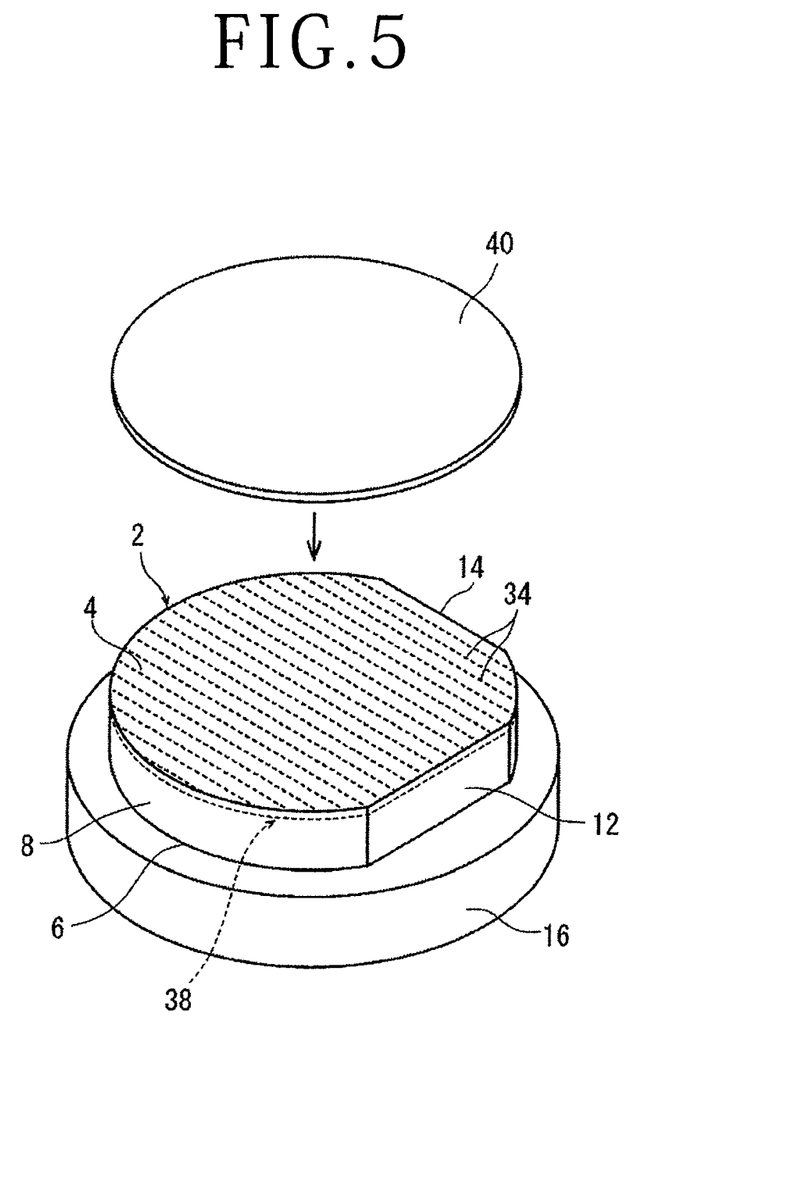
FIG. 5 is a perspective view depicting a substrate attaching step of attaching a substrate to the SiC ingot.

Wavelength of the pulsed laser beam: 1064 nm
Repetition frequency: 80 kHz
Average power: 3.2 W
Pulse width: 4 ns
Spot diameter: 3 μm
Numerical aperture (NA) of the focusing lens: 0.43
Index amount: 250 to 400 μm
Feed speed: 120 to 260 mm/s After performing the separation layer forming step, a substrate attaching step is performed to attach a substrate to the upper surface of the SiC ingot 2. As depicted in FIG. 5, a disk-shaped glass substrate 40 is attached to the first end surface 4 (the end surface near the separation layer 38) of the SiC ingot 2 by using a suitable adhesive (e.g., polyimide resin adhesive). The substrate 40 has a diameter substantially the same as that of the SiC ingot 2. The substrate 40 has a thickness capable of preventing damage to the SiC substrate produced from the SiC ingot 2 in processing the SiC substrate in the condition where the SiC substrate is held by the substrate 40. For example, the thickness of the substrate 40 is set to approximately 500 to 1000 μm.

After performing the substrate attaching step, a separating step is performed to separate the SiC substrate with the substrate 40 from the SiC ingot 2 along the separation layer 38 by applying an external force to the separation layer 38. For example, the separating step may be performed by using a water tank 42 depicted in FIG. 6 and applying ultrasonic vibration to the SiC ingot 2 immersed in the water stored in the water tank 42.

Figure 6:
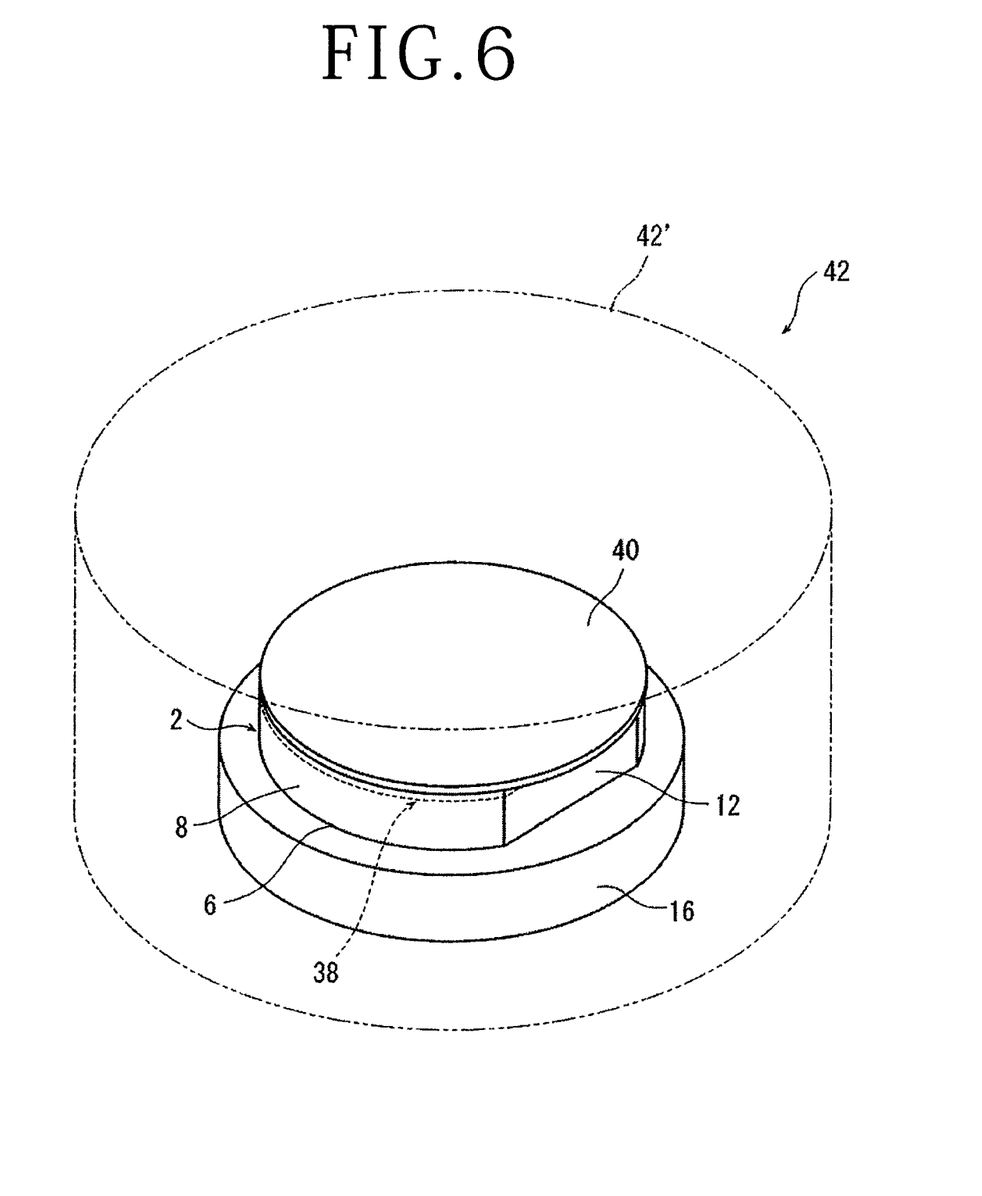
FIG. 6 is a perspective view depicting a separating step of separating an SiC substrate from the SiC ingot.

In performing the separating step, the SiC ingot 2 is first moved into the water tank 42. The water tank 42 may be formed in the following manner. A hollow cylindrical member 42' having an upper opening end and a lower opening end is vertically movably provided. Thereafter, the holding table 16 holding the SiC ingot 2 with the substrate 40 is moved to a position where the separating step is to be performed. Thereafter, the lower opening end of the cylindrical member 42' is brought into contact with the upper surface of a base (not depicted) on which the holding table 16 is mounted or contact with the upper surface of the holding table 16 at its peripheral portion, thereby forming the water tank 42 having a closed lower end. In this condition, the SiC ingot 2 is stored into the water tank 42. Thereafter, water is supplied into the water tank 42 until the SiC ingot 2 is immersed in the water. Thereafter, an ultrasonic vibrator (not depicted) is immersed in the water stored in the water tank 42 and then operated. For example, the ultrasonic vibrator may be formed from a piezoelectric ceramic. In operating the ultrasonic vibrator, the ultrasonic vibrator may be kept in contact with the SiC ingot 2 or may be spaced from the SiC ingot 2 by a suitable distance (e.g., 2 to 3 mm). When the ultrasonic vibrator is operated, the separation layer 38 is stimulated by the ultrasonic vibration and accordingly broken, so that an SiC substrate 44 (see FIG. 7A) with the substrate 40 can be separated from the SiC ingot 2 along the separation layer 38 as a separation start point. As a modification, the separating step may be performed by using a wedge-shaped member like a chisel having a thickness gradually reduced to the tip and applying a shock to the separation layer 38.

Figure 7A:
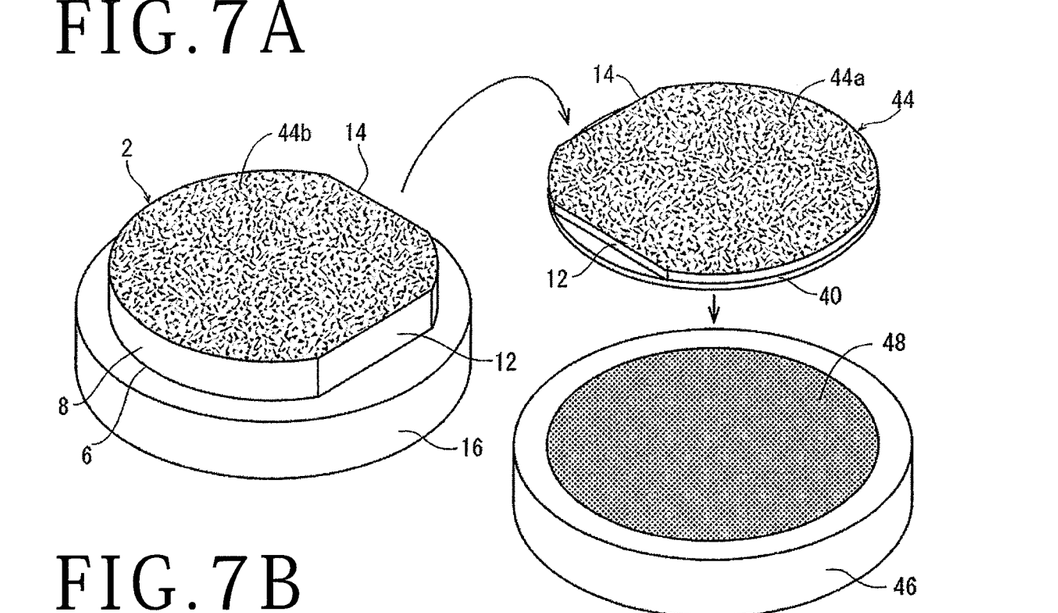
FIG. 7A is a perspective view depicting a manner of separating the SiC substrate from the SiC ingot and then placing the SiC substrate through the substrate on a chuck table.

After performing the separating step, a separation surface flattening step is performed to flatten a separation surface of the SiC substrate 44 attached to the substrate 40, the separation surface being a rough surface obtained by breaking the separation layer 38 in the separating step mentioned above. The separation surface flattening step may be performed by using the grinding apparatus 18 mentioned above and a chuck table 46 (see FIG. 7B) for holding the SiC substrate 44 under suction. As depicted in FIG. 7A, the chuck table 46 has an upper surface provided with a circular vacuum chuck 48. The vacuum chuck 48 is formed of a porous material, and it is connected to suction means (not depicted) producing a suction force. Accordingly, the suction force produced by the suction means can be applied to the upper surface of the vacuum chuck 48, thereby holding the SiC substrate 44 on the upper surface of the vacuum chuck 48 under suction. Further, the chuck table 46 is rotatable about its vertical axis. The chuck table 46 is also movable between a grinding position below the grinding apparatus 18 and a standby position retracted from the grinding position.

Figure 7B:
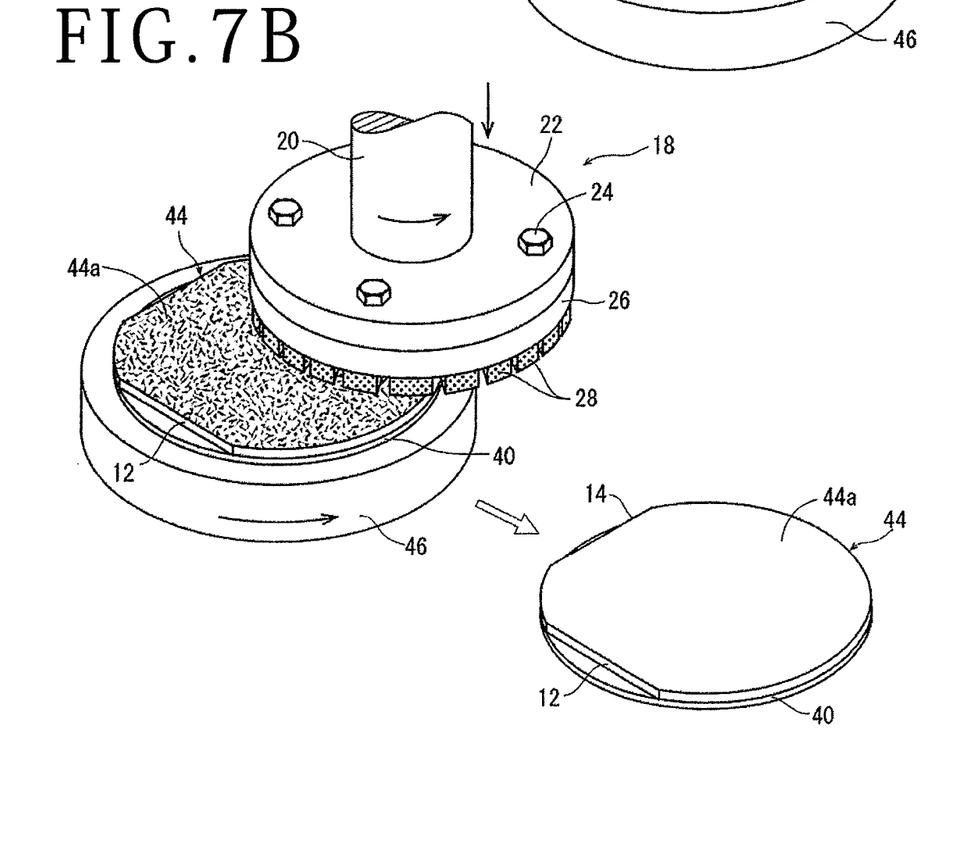
FIG. 7B is a perspective view depicting a separation surface flattening step of flattening a separation surface of the SiC substrate separated from the SiC ingot along the separation layer.

In performing the separation surface flattening step, the SiC substrate 44 attached to the substrate 40 is first held on the upper surface of the chuck table 46 under suction in the condition where a separation surface 44*a* of the SiC substrate 44 is oriented upward as depicted in FIG. 7A. In other words, the SiC substrate 44 attached to the substrate 40 is held through the substrate 40 on the chuck table 46 under suction. Thereafter, the chuck table 46 is moved to the grinding position. Thereafter, as depicted in FIG. 7B, the chuck table 46 is rotated at a predetermined speed (e.g., 300 rpm) in a counterclockwise direction as viewed in plan. Further, the spindle 20 is rotated at a predetermined speed (e.g., 6000 rpm) in a counterclockwise direction as viewed in plan. Thereafter, the spindle 20 is lowered by operating the elevating means (not depicted) of the grinding apparatus 18, thereby bringing the abrasive members 28 into contact with the separation surface 44*a* of the SiC substrate 44. Thereafter, the spindle 20 is further lowered at a predetermined feed speed (e.g., 0.1 μm/s), thereby grinding the separation surface 44*a* of the SiC substrate 44 attached to the substrate 40. Accordingly, the separation surface 44*a* of the SiC substrate 44 can be flattened. In other words, the roughness of the separation surface 44*a* can be removed. On the other hand, the SiC ingot 2 in the condition after performing the separating step also has a separation surface 44*b* as a rough surface obtained by breaking the separation layer 38. Accordingly, the separation surface 44*b* of the SiC ingot 2 held on the holding table 16 as depicted in FIG. 7A is flattened by performing the upper surface flattening step as mentioned previously with reference to FIG. 3. Thereafter, the separation layer forming step, the substrate attaching step, and the separating step are repeated to thereby produce a plurality of similar SiC substrates 44 from the SiC ingot 2. Thereafter, the separation surface flattening step is similarly performed to each of the SiC substrates 44 produced above.

Figure 8:
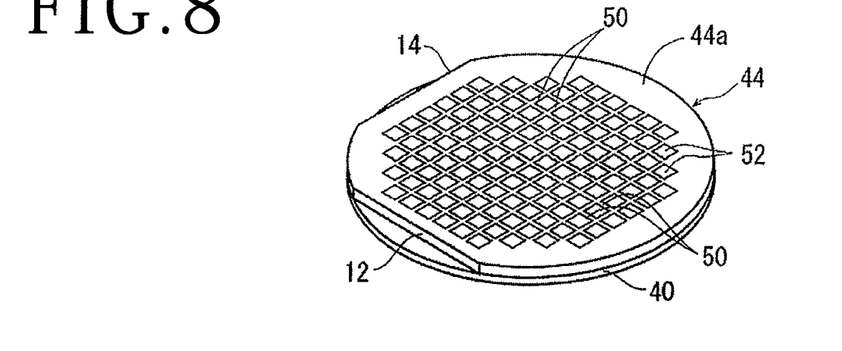
FIG. 8 is a perspective view of the SiC substrate in the condition where devices have been formed on the flat separation surface of the SiC substrate by performing a device forming step.

After performing the separation surface flattening step, a device forming step is performed to form devices on the flat separation surface 44*a* of the SiC substrate 44. As depicted in FIG. 8, a plurality of crossing division lines 50 are formed on the flat separation surface 44*a* of the SiC substrate 44 to thereby define a plurality of rectangular separate regions. In these plural separate regions, a plurality of devices 52 such as power devices and LEDs are respectively formed. In this device forming step, the substrate 40 is kept attached to the SiC substrate 44. Accordingly, in processing the SiC substrate 44 in this device forming step, possible damage to the SiC substrate 44 can be suppressed by the substrate 40.

Figure 9A:
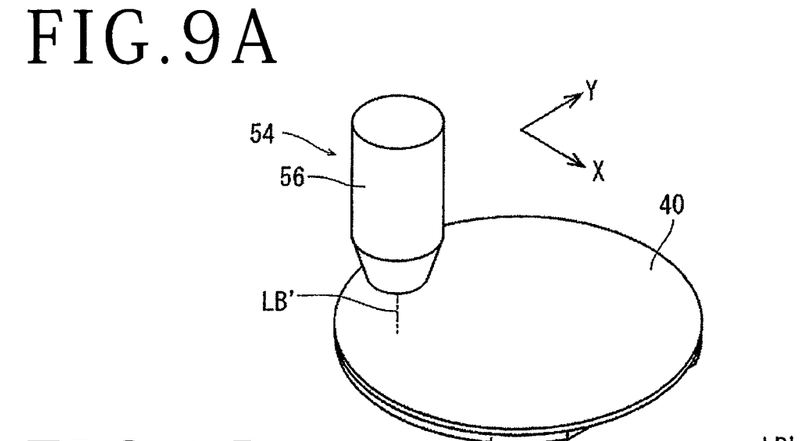
FIG. 9A is a perspective view depicting a substrate removing step of removing the substrate from the SiC substrate.

After performing the device forming step, a substrate removing step is performed to remove the substrate 40 from the SiC substrate 44 on which the devices 52 have been formed. The substrate removing step may be performed by using a laser processing apparatus 54, a part of which is depicted in FIG. 9A. The laser processing apparatus 54 includes a chuck table (not depicted) for holding a workpiece under suction and focusing means 56 having a focusing lens (not depicted) for focusing a pulsed laser beam LB' and applying this pulsed laser beam LB' to the workpiece held on the chuck table under suction. The focusing means 56 is movable back and forth both in the X direction depicted by an arrow X in FIG. 9A and in the Y direction depicted by an arrow Y in FIG. 9A.

Figure 9B:
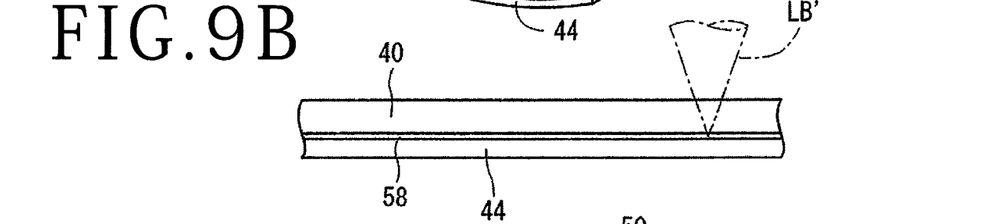
FIG. 9B is a sectional view depicting the substrate removing step depicted in FIG. 9A.
Figure 9C:
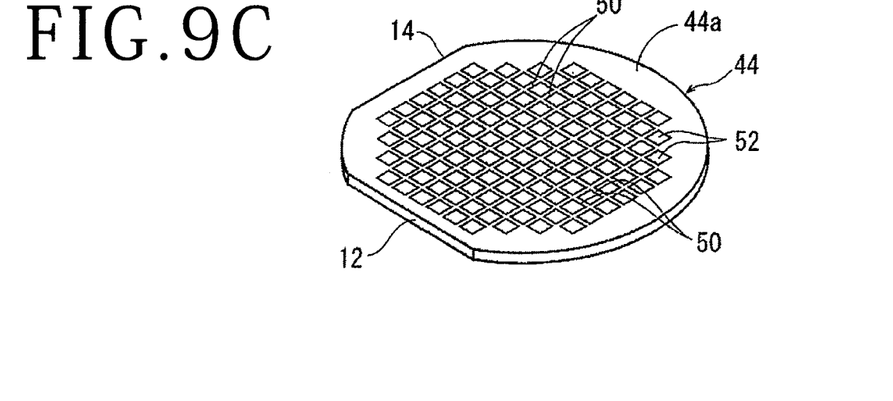
FIG. 9C is a perspective view of the SiC substrate in the condition where the substrate has been removed from the SiC substrate.

In performing the substrate removing step, the SiC substrate 44 attached to the substrate 40 is first held on the upper surface of the chuck table under suction in the condition where the substrate 40 is oriented upward as depicted in FIGS. 9A and 9B. Thereafter, focal position adjusting means (not depicted) included in the laser processing apparatus 54 is operated to vertically move the focusing means 56, thereby setting the focal point of the pulsed laser beam LB' at a predetermined depth corresponding to an adhesive layer 58 bonding the substrate 40 and the SiC substrate 44. Thereafter, the pulsed laser beam LB' is applied from the focusing means 56 to the adhesive layer 58 as moving the focusing means 56 in the X direction at a predetermined feed speed. By applying the pulsed laser beam LB' to the adhesive layer 58, the adhesive layer 58 is broken along one line. Thereafter, the focusing means 56 is moved in the Y direction by a predetermined index amount, and the pulsed laser beam LB' is then similarly applied to the adhesive layer 58 along another line. In this manner, the laser applying operation and the indexing operation are suitably repeated to fully break the adhesive layer 58 to such a degree that the substrate 40 can be removed from the SiC substrate 44. Thereafter, the substrate 40 is removed from the SiC substrate 44 to thereby obtain the SiC substrate 44 having the devices 52 as depicted in FIG. 9C. In applying the pulsed laser beam LB' to the adhesive layer 58 and in performing the indexing operation, the chuck table may be moved with the focusing means 56 fixed in position. For example, this substrate removing step may be performed under the following laser processing conditions.

Wavelength of the pulsed laser beam: 355 nm
Repetition frequency: 80 kHz
Average power: 1.5 W
Pulse width: 4 ns
Spot diameter 3 μm
Numerical aperture (NA) of the focusing lens: 0.43
Index amount: 100 μm
Feed speed: 240 mm/s As described above, the separation layer 38 is formed at a shallow position (e.g., approximately 30 to 100 μm) from the upper surface of the SiC ingot 2 in the separation layer forming step. Accordingly, the relatively thin SiC substrate 44 is produced by separating the SiC ingot 2 along the separation layer 38 in the separating step. However, since the substrate 40 is attached to the SiC substrate 44 after performing the separation layer forming step, possible damage to the SiC substrate 44 in the device forming step can be suppressed. Thus, the SiC substrate 44 having a thickness smaller than that of the conventional SiC substrate can be produced from the SiC ingot 2 according to this preferred embodiment. Accordingly, a greater number of SiC substrates 44 can be produced efficiently from the SiC ingot 2 as compared with the prior art.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. An SiC substrate processing method for producing an SiC substrate wafer from an SiC ingot, comprising:

a separation layer forming step of setting a focal point of a laser beam having a transmission wavelength to SiC inside the SiC ingot at a depth from an upper surface of the SiC ingot, and next applying the laser beam to the SiC ingot to thereby form a separation layer for separating the SiC substrate wafer from the SiC ingot;

a substrate attaching step of attaching a substrate to the upper surface of the SiC ingot after performing the separation layer forming step;

a separating step of applying an external force to the separation layer after performing the substrate attaching step, thereby separating the SiC substrate wafer with the attached substrate from the SiC ingot along the separation layer;

a separation surface flattening step of flattening a rough separation surface of the SiC substrate wafer attached to the substrate after performing the separating step, thereby removing the roughness of the rough separation surface to obtain a flat surface of the SiC substrate wafer;

a device forming step of forming devices on the flat surface of the SiC substrate wafer after performing the separation surface flattening step and while the SiC substrate wafer is attached to the substrate; and a substrate removing step of removing the substrate from the SiC substrate wafer having the devices on the flat surface after performing the device forming step to yield the SiC substrate wafer having the devices thereon.

2. The SiC substrate processing method according to claim 1, further comprising:

an upper surface flattening step of flattening the upper surface of the SiC ingot before performing the separation layer forming step.

3. The SiC substrate processing method according to claim 1, wherein the depth from the upper surface of the SiC ingot is set to between about 30 to 100 μm.

* * * * *